United States Patent
Lin et al.

(10) Patent No.: US 11,849,649 B2
(45) Date of Patent: Dec. 19, 2023

(54) METHOD FOR FABRICATING MEMORY CELL OF MAGNETORESISTIVE RANDOM ACCESS MEMORY

(71) Applicant: United Microelectronics Corp., Hsinchu (TW)

(72) Inventors: Da-Jun Lin, Kaohsiung (TW); Bin-Siang Tsai, Changhua County (TW); Ting-An Chien, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 32 days.

(21) Appl. No.: 17/573,641

(22) Filed: Jan. 12, 2022

(65) Prior Publication Data

US 2022/0140229 A1 May 5, 2022

Related U.S. Application Data

(62) Division of application No. 16/656,304, filed on Oct. 17, 2019, now Pat. No. 11,258,005.

(51) Int. Cl.
*H10N 50/80* (2023.01)
*H10N 50/01* (2023.01)
*H10N 50/85* (2023.01)

(52) U.S. Cl.
CPC ............ *H10N 50/80* (2023.02); *H10N 50/01* (2023.02); *H10N 50/85* (2023.02)

(58) Field of Classification Search
CPC ................................................. H10N 50/00–10
See application file for complete search history.

(56) References Cited

U.S. PATENT DOCUMENTS

| | | | |
|---|---|---|---|
| 9,269,894 B2 | 2/2016 | Mudivarthi et al. |
| 10,158,065 B2 | 12/2018 | Doyle et al. |
| 10,191,719 B2 | 1/2019 | Bandiera et al. |
| 2004/0120184 A1 | 6/2004 | Janesky et al. |
| 2004/0201929 A1 | 10/2004 | Hashimoto et al. |

OTHER PUBLICATIONS

Mahendra Pakala, "Perpendicular MTJ stack development for STT MRAM on Endura PVD platform," Applied Materials, Dec. 2014, pp. 1-23.

*Primary Examiner* — Suberr L Chi
(74) *Attorney, Agent, or Firm* — JCIPRNET

(57) ABSTRACT

A method for fabricating memory cell of magnetoresistive RAM includes forming a memory stack structure on a first electrode layer. The memory stack structure includes a SAF layer to serve as a pinned layer; a magnetic free layer and a barrier layer sandwiched between the SAF layer and the magnetic free layer. A second electrode layer is then formed on the memory stack structure. The SAF layer includes a first magnetic layer, a second magnetic layer, and a spacer layer of a first metal element sandwiched between the first magnetic layer and the second magnetic layer. The first metal element is phase separated from a second metal element of the first and second magnetic layers, and the second metal element of the first magnetic layer and the second magnetic layer interfaces with the spacer layer.

6 Claims, 4 Drawing Sheets

METHOD FOR FABRICATING MEMORY CELL OF MAGNETORESISTIVE RANDOM ACCESS MEMORY

CROSS-REFERENCE TO RELATED APPLICATION

This application is a divisional application of U.S. patent application Ser. No. 16/656,304, filed on Oct. 17, 2019, now allowed. The entirety of the above-mentioned patent application is hereby incorporated by reference herein and made a part of this specification.

BACKGROUND

1. Field of the Invention

The present invention generally relates to semiconductor fabrication, and particularly to a method for fabricating a memory cell of magnetoresistive random access memory (MRAM).

2. Description of Related Art

The non-volatile memory device is almost an absolutely required equipment in a digital electronic product. The digital electronic products such as computer system, mobile phone, camera, video apparatus, and so on, are also the necessary products in the daily life. Therefore, the non-volatile memory device is commonly required.

The memory device is composed of a large number of memory cells to store binary data. Various structures of memory cells have been proposed in the art. The performance of the memory cell would affect the performance of the memory device. The MRAM cell is one of various proposed cell structures and has been widely taken to design the memory device in the market.

However, the performance of the MRAM cell is still needed to be maintained or improved when the cell size is greatly reduced as a trend. As known, if the performance of the MRAM cell is getting worse, the data error as stored therein may occur after accessing the memory cells for a large number of times under a certain high temperature due to operation. The design to reduce the data error is at least still intended to develop the MRAM device.

SUMMARY OF THE INVENTION

The invention provides a method for fabricating memory cell of magnetoresistive RAM (MRAM). The degradation of performance of MRAM cell may be effectively reduced. The occurrence of data error may be effectively reduced.

In an embodiment, the invention provides a method for fabricating memory cell of magnetoresistive RAM. The method comprises forming a memory stack structure on a first electrode layer. The memory stack structure comprises a synthetic anti-ferromagnetic (SAF) layer to serve as a pinned layer; a magnetic free layer and a barrier layer sandwiched between the SAF layer and the magnetic free layer. A second electrode layer is formed on the memory stack structure. The SAF layer comprises a first magnetic layer, a second magnetic layer, and a spacer layer of a first metal element sandwiched between the first magnetic layer and the second magnetic layer. The first metal element is phase separated from a second metal element of the first and second magnetic layers, and the second metal element of the first magnetic layer and the second magnetic layer interfaces with the spacer layer.

In an embodiment, as to the method for fabricating memory cell of magnetoresistive RAM, the first metal element and the second metal element are immiscible in phase under a temperature range.

In an embodiment, as to the method for fabricating memory cell of magnetoresistive RAM, the first metal element is Ir or Ag and the second metal element is Pt or Cu.

In an embodiment, as to the method for fabricating memory cell of magnetoresistive RAM, the SAF layer directly contacts the first electrode layer or the magnetic free layer directly contacts the first electrode layer.

In an embodiment, as to the method for fabricating memory cell of magnetoresistive RAM, each of the first magnetic layer and the second magnetic layer is formed by Co layers and Pt layers, alternatively interposed, wherein one of the Pt layers is disposed on the spacer layer.

In an embodiment, as to the method for fabricating memory cell of magnetoresistive RAM, the spacer is Ir or Ag.

In an embodiment, as to the method for fabricating memory cell of magnetoresistive RAM, it further comprises performing an oxidation process to form an oxide side layer on a sidewall of each of the first magnetic layer and the second magnetic layer, wherein the spacer layer has an exposed sidewall not covered by the oxide side layer. A dielectric cap layer is formed on the oxide side layer and covering the exposed sidewall of the spacer layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a cell structure of magnetoresistive RAM (MRAM) device, in which a synthetic anti-ferromagnetic (SAF) layer is involved to serve as a pinned layer or a reference layer. If the state of the SAF layer is not stable, the data stored in the magnetic free layer would get error. The invention has looked into the performance of the SAF layer and provides a stacked structure for the SAF layer with relatively more stable of the anti-ferromagnetic state even under the high operation temperature for a certain long period in operation.

Several embodiments are provided to describe the invention. However, the invention is not just limited the embodiments as provided. Even further, the embodiments between them may be combined into another embodiment.

The general structure of MRAM cell includes a magnetic pinned layer, a barrier layer and a magnetic free layer as a stacked. The magnetic pinned layer has a fixed magnetization direction, serving as a reference magnetization direction. The magnetization direction of the magnetic free layer is depending on the programming operation to be parallel or anti-parallel to the reference magnetization direction.

The magnetoresistance due to the anti-parallel state or the parallel state between the pinned layer and the magnetic free layer has different levels, so to store the binary data. In the operation, the pinned layer should provide the reference magnetization direction without changing in operation. The pinned layer is usually formed by SAF structure. The SAF structure, which forms as the anti-ferromagnetic state in two magnetic layers, separate by a non-magnetic metal layer, such as Ru. The non-magnetic metal layer is serving as a spacer layer.

Figure 1:
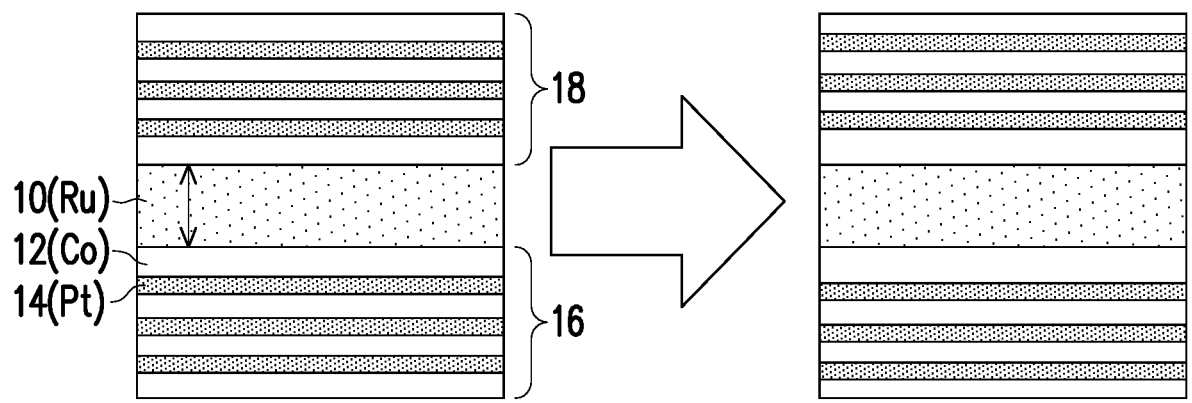
FIG. 1 is a drawing, schematically illustrating a cross-section of a stack structure of a usual SAF layer as looked into, according to an embodiment of the invention.

FIG. 1 is a drawing, schematically illustrating a cross-section of a stack structure of a usual SAF layer as looked into, according to an embodiment of the invention. Referring to FIG. 1, a spacer layer 10 as a non-magnetic metal layer, such as Ru, is sandwiched by two magnetic layers 16, 18. Each magnetic layer 16, 18 may be form by multiple Co layers 12 and multiple Pt layers 14. The magnetic layer 16 and the magnetic layer 18 ideally are set to form the anti-ferromagnetic coupling state without change in operation.

As observed in the invention, the thickness of the spacer layer 10 of the SAF structure would affect the interlayer exchange coupling (IEC) energy state, in which the Ruderman-Kittel-Kasuya-Yosida-like (RKKY) state would be changed to the ferromagnetic coupling state or decoupling state if the thickness of the spacer layer is over thick, as seen the right part in FIG. 1. Once the RKKY state of the SAF layer is changed to the ferromagnetic coupling state or decoupling state, the data as stored would get error, due to SAF function failure or function degradation.

The factor to cause the thickness increase of the spacer layer 10 in SAF layer is the diffusion between the Ru in the spacer layer 10 and the Co layer 12 of the magnetic layers 16, 18 in the SAF structure. The thickness increase of the spacer layer 10 would change the anti-ferromagnetic state into the ferromagnetic state due to the RKKY effect. The SAF layer as changed to the ferromagnetic state then causes an error of the reference magnetization direction.

To avoid the thickness increase of the spacer layer 10 from suffering high operation temperature in an example and then causing a diffusion of the Ru into the magnetic layers 16, 18 in FIG. 1, the Ru metal of the spacer layer 10 may be changed to Ir in an embodiment, or Ag in an embodiment. However, the invention is not limited to the embodiments. Generally, the material of non-magnetic metal layer as the spacer layer being phase immiscible from the magnetic layer may be taken.

Figure 2:
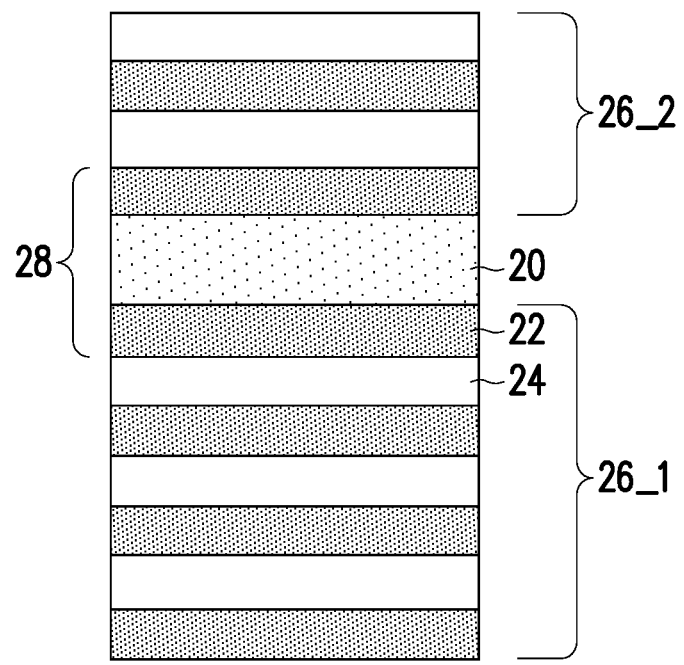
FIG. 2 is a drawing, schematically illustrating a cross-section of a stack structure of a SAF layer, according to an embodiment of the invention.

FIG. 2 is a drawing, schematically illustrating a cross-section of a stack structure of a SAF layer, according to an embodiment of the invention. Referring to FIG. 2, the SAF layer includes a spacer layer 20, sandwiched by a magnetic layers 26_1 and another magnetic layer 26_2. The material of the spacer layer 20 is Ir or Ag in an example. As previously stated, generally, the material of non-magnetic metal layer as the spacer layer 20 being phase immiscible from the magnetic layer 26_1, 26_2 may be taken.

Each magnetic layer 26_1, 26_2 in an embodiment may include multiple Co layers 24 and multiple Pt layers 22, alternatively interposed, wherein one of the Pt layers 22 is disposed on the spacer layer 20. Further in an embodiment, the Pt layer 22 may be replaced by Pd layer or combined with Pd layer. In an embodiment, the Pt layer 22 may be replaced by Cu layer.

The selection of the materials for the spacer layer 20 and the interfacing layer (Pt layer 22) with respect to the spacer layer 20 is to have a phase immiscible state between the materials as selected. The interfacing region 28 involved Pt—Ir—Pt or Pt—Ag—Pt as the examples are expected. The interface diffusion in the interfacing region 28 may be suppressed due to the immiscible feature. As a result, the anti-ferromagnetic interlayer exchange coupling (IEC) function may be maintained, so to provide larger thermal budget window for process integration.

As noted, the magnetic layer 26_1 and the magnetic layer 26_2 may be symmetric in stack sequence. However, the magnetic layer 26_1 and the magnetic layer 26_2 in an embodiment may be different, the invention is not necessary to limit the stack structure. However, the immiscible phase at the interfacing region 28 would be properly set.

Figure 3:
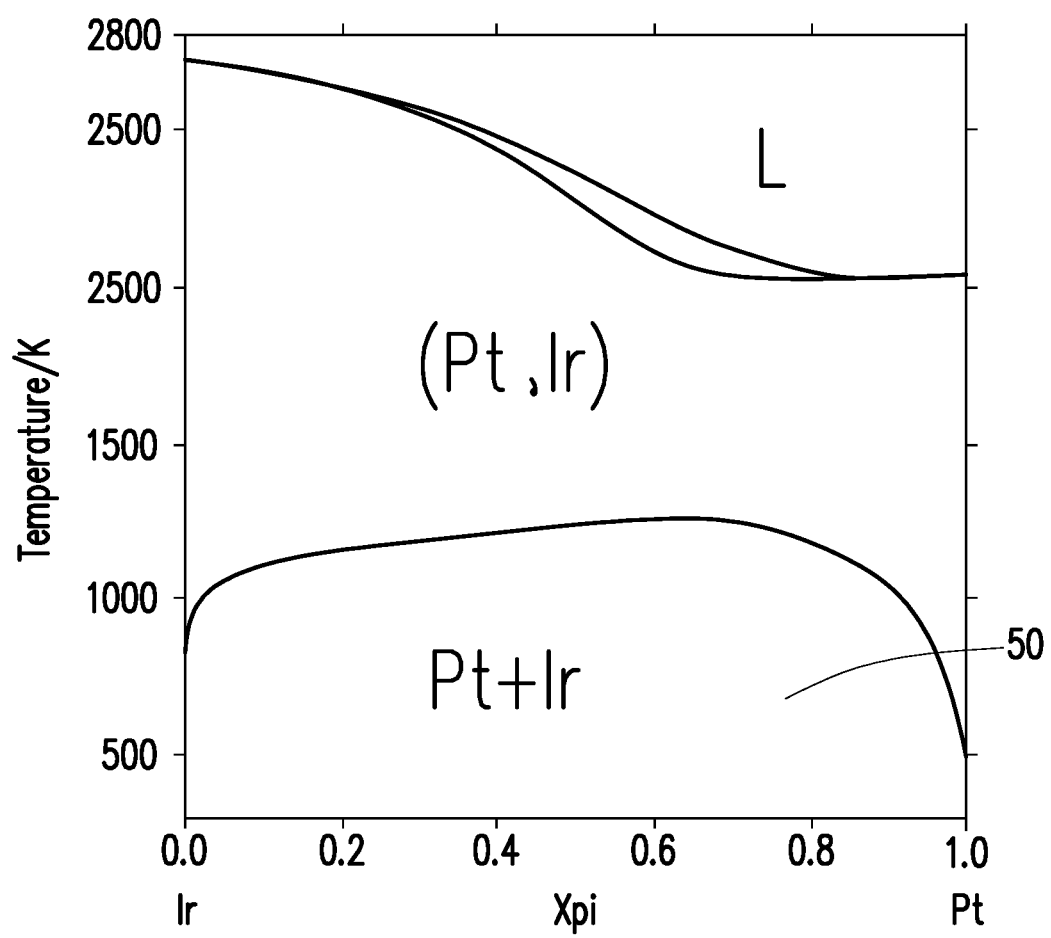
FIG. 3 is a drawing, schematically illustrating a phase separation phenomenon in a phase diagram of Ir—Pt, theoretically, according to an embodiment of the invention.

FIG. 3 is a drawing, schematically illustrating a phase separation phenomenon in a phase diagram of Ir—Pt, theoretically, according to an embodiment of the invention. Referring to FIG. 3, the phase immiscible phenomenon is shown for the example between Ir and Pt. The vertical axis is temperature the horizontal axis is a ratio (Xpi) of Pt in the mix of Ir and Pt. As observed from the theoretically model, the phase region 50 in the phase diagram represent that the Ir and Pt are phase separation, immiscible, indicated by Pt+Ir. The phase region indicated by (Pt, Ir) is mixed region. The phase region indicated by L is the liquid region. The operation temperature of the MRAM cell is usually around 400 K. In this situation the materials of Pt and Ir are in the immiscible state without diffusion to each other. The interface region 28 may be maintained without increase after a certain period of operation at the operation temperature.

Figure 4A:
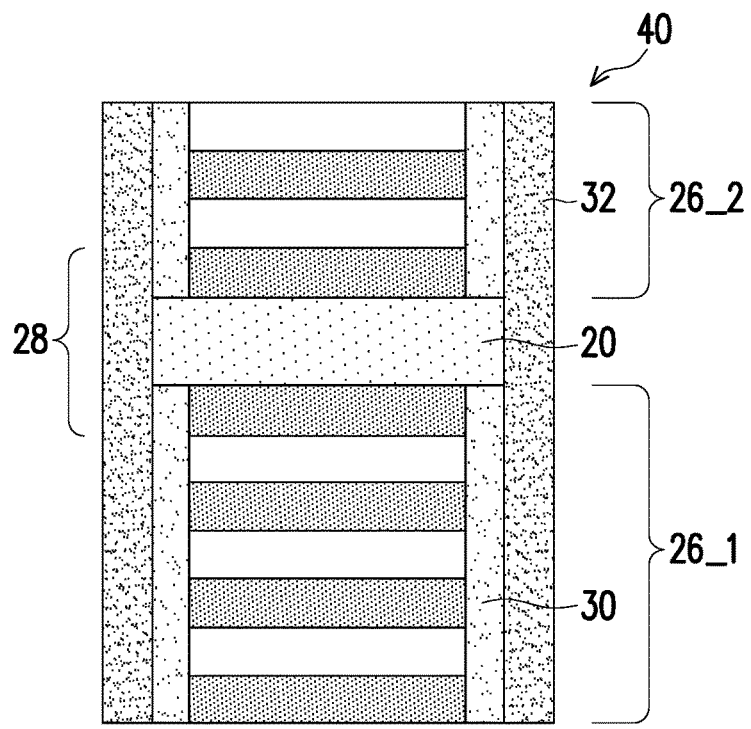
FIG. 4A and FIG. 4B are drawings, schematically illustrating a cross-section of a stack structure of a SAF layer with protection, according to an embodiment of the invention.
Figure 4B:
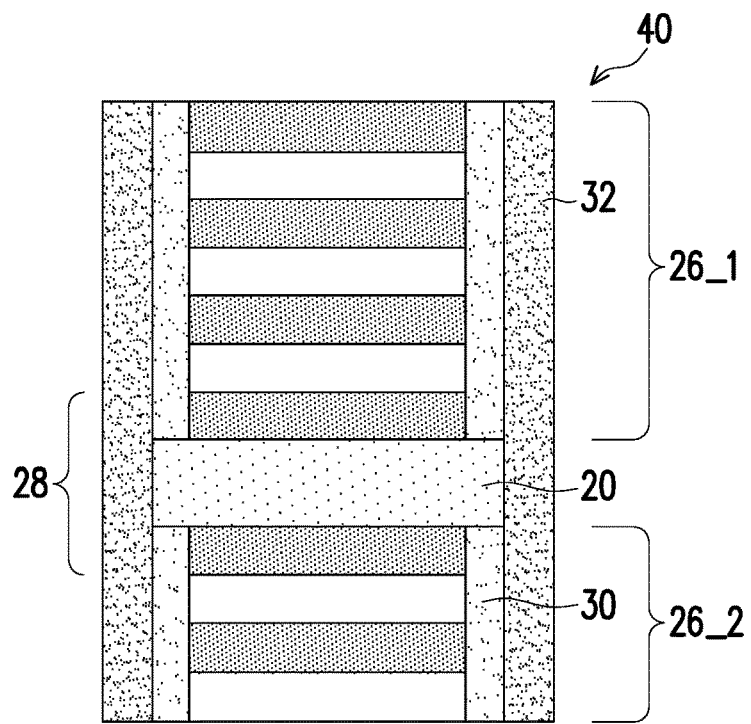

FIG. 4A and FIG. 4B are drawings, schematically illustrating a cross-section of a stack structure of a SAF layer with protection, according to an embodiment of the invention. Referring to FIG. 4A, the further protection on the sidewall of the SAF layer may be taken. An oxidation process may be performed to form a sidewall spacer 30 on the sidewall of the magnetic layer 26_1 and magnetic layer 26_2. However, the spacer layer 20 is substantially not oxidized due to the material property. Further, a dielectric spacer 32 is formed to fully cover the sidewall of the SAF layer, in which the dielectric spacer 32 covers the sidewall of the spacer layer 20 and on the sidewall spacer 30. The SAF layer 40 with the protection on the sidewall is basically formed. The SAF layer 40 with the protection actually is a part of the MRAM cell to serve as the pinned layer and to provide a stable magnetization direction as a reference. Referring to FIG. 4B, alternatively in an embodiment, the stack sequence in FIG. 4A may be reversed. In this structure, the magnetic layer 26_1 may be disposed on the top side and the magnetic layer 26_2 may be disposed at the bottom side, with respect to the spacer layer 20.

Figure 5:
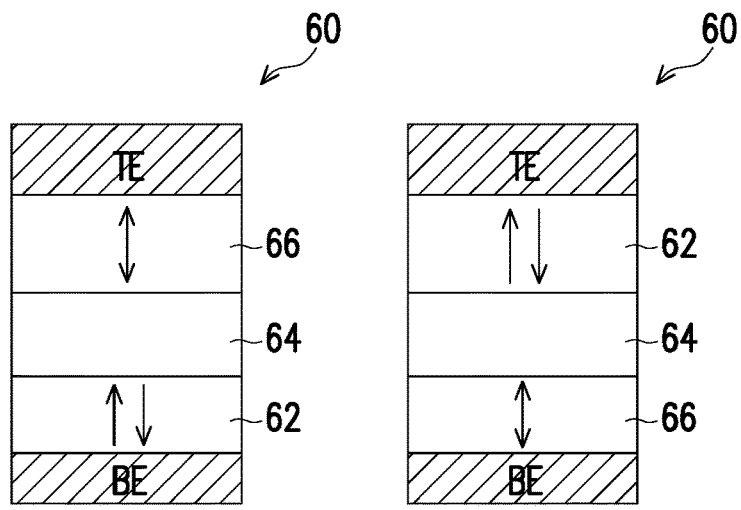
FIG. 5 is a drawing, schematically illustrating a cross-section of a cell structure of MRAM device, according to an embodiment of the invention.

FIG. 5 is a drawing, schematically illustrating a cross-section of a cell structure of MRAM device, according to an embodiment of the invention. Referring to FIG. 5, the cell structure 60 of the MRAM device is to be connected to the voltage electrodes, such as the bottom electrode BE and the top electrode TE. However, the stack sequence of the SAF layer 62, the barrier layer 64 and the magnetic free layer 66 may be adjusted according to the actual fabrication. The barrier layer 64 in an embodiment is MgO, which is another spacer layer.

In an embodiment, as shown in the left part of the drawing, the SAF layer 62 is disposed on the bottom electrode BE. The barrier layer 64 is disposed on the SAF layer 62 and the magnetic free layer 66 is disposed on the barrier layer 64. The top electrode TE is disposed on the magnetic free layer 66.

In an embodiment, as shown in the right part of the drawing, the magnetic free layer 66 is disposed on the bottom electrode BE. The barrier layer 64 is disposed on the magnetic free layer 66 and the SAF layer 62 is disposed on the barrier layer 64. The top electrode TE is disposed on the SAF layer 62.

In addition, the magnetization of the magnetic free layer 66 may be freely flipped forward and backward with respect to one direction according to the operation on the memory cell, so as to form the anti-parallel state and parallel state to the reference magnetization from the SAF layer 62. The magnetic free layer usually is also formed from multiple CoFeB layers, which are also separated by other spacers between the CoFeB layers. However, the invention is not limited to a specific magnetic free layer.

Figure 6:
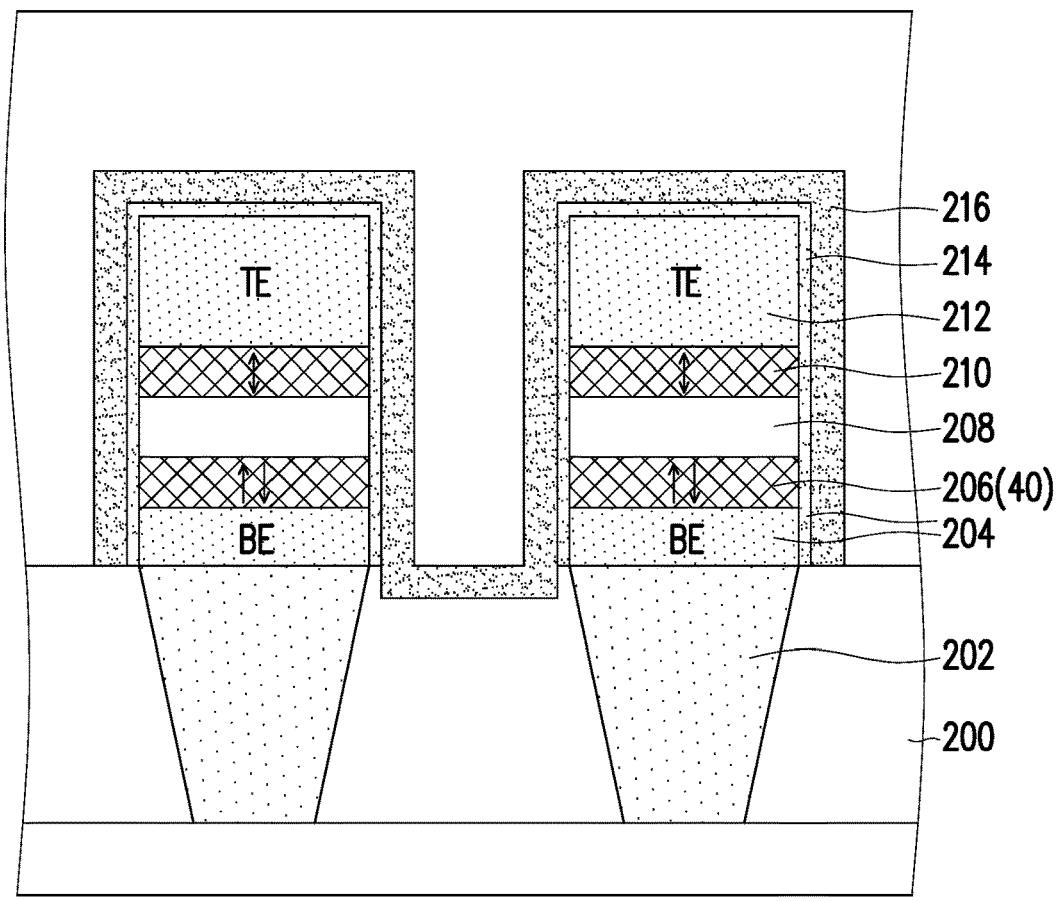
FIG. 6 is a drawing, schematically illustrating cross-section of a cell structure of MRAM device, according to an embodiment of the invention.

Further in an embodiment, FIG. 6 is a drawing, schematically illustrating cross-section of a cell structure of MRAM device, according to an embodiment of the invention.

Referring to FIG. 6, in an embodiment, a metal contact 202 may be formed in the substrate 200. The metal contact 202 generally is a part of interconnection to the lower device. The metal contact 202 may also be a via structure in an embodiment.

A bottom electrode layer 204 is formed on the substrate 200 in contact with the metal contact 202. A SAF layer 206 with the structure of the SAF layer 40 in FIG. 4 is disposed on the bottom electrode layer 204. A barrier layer 208 is disposed on the SAF layer 206. A magnetic free layer 210 is disposed on the barrier layer 208. A top electrode layer 212 is disposed on the magnetic free layer 210.

As to the fabrication process, in an embodiment, preliminary layers of the top electrode layer 212, the magnetic free layer 210, the barrier layer 208 and the SAF layer 206 and the bottom electrode layer 204 may be formed as a preliminary stack layer. Then, the patterning process is performed to pattern the preliminary stack layer to have the cell stack, individually.

The detail structure of the SAF layer 206 is described in FIG. 4 as an example. As to the protection, an oxidation process is performed to form the sidewall spacer 214 on the sidewall of the cell stack except the spacer layer 20 in FIG. 4 for the detail. The drawing in FIG. 6 does not show the detail part of the oxide layer 30 corresponding to FIG. 4. Then, a hard mask layer 216, such as a dielectric layer, is further formed over the cell stacks. In an embodiment, the hard mask layer 216 may be SiN, SiON, . . . etc.

The invention does not limit the way to form the subsequent stack elements after the SAF layer is formed as proposed. The invention provides the SAF layer with the spacer layer sandwiched by two magnetic layers. Due to the selection materials to create the immiscible interface region 28, the thickness of the interface region 28 may be substantially maintained. The anti-ferromagnetic state may be stable under operation with less possibility to change to ferromagnetic state due to the RKKY effect when the large thickness of the interface region 28 occurs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating memory cell of magnetoresistive RAM, comprising:
    forming a memory stack structure on a first electrode layer, the memory stack structure comprising:
        a synthetic anti-ferromagnetic (SAF) layer to serve as a pinned layer;
        a magnetic free layer; and
        a barrier layer, sandwiched between the SAF layer and the magnetic free layer; and
    forming a second electrode layer on the memory stack structure,
    wherein the SAF layer comprises:
        a first magnetic layer;
        a second magnetic layer; and
        a spacer layer of a first metal element sandwiched between the first magnetic layer and the second magnetic layer,
        wherein the first metal element is phase separated from a second metal element of the first and second magnetic layers, the second metal element of the first magnetic layer and the second magnetic layer interfaces with the spacer layer, and the first metal element and the second metal element are immiscible in phase under a temperature range.

2. The method for fabricating memory cell of magnetoresistive RAM as recited in claim 1, wherein the first metal element is Ir or Ag and the second metal element is Pt or Cu.

3. The method for fabricating memory cell of magnetoresistive RAM as recited in claim 1, wherein the SAF layer directly contacts the first electrode layer or the magnetic free layer directly contacts the first electrode layer.

4. The method for fabricating memory cell of magnetoresistive RAM as recited in claim 1, wherein each of the first magnetic layer and the second magnetic layer is formed by Co layers and Pt layers, alternatively interposed, wherein one of the Pt layers is disposed on the spacer layer.

5. The method for fabricating memory cell of magnetoresistive RAM as recited in claim 4, wherein the spacer is Ir or Ag.

6. The method for fabricating memory cell of magnetoresistive RAM as recited in claim 1, further comprising:
    performing an oxidation process to form an oxide side layer on a sidewall of each of the first magnetic layer and the second magnetic layer, wherein the spacer layer has an exposed sidewall not covered by the oxide side layer; and
    forming a dielectric cap layer on the oxide side layer and covering the exposed sidewall of the spacer layer.

* * * * *